Jan. 19, 1965 C. J. KEVANE ETAL 3,166,680
TIME DELAY SWITCH
Filed July 26, 1962

INVENTORS
RAYMOND J. SCHULTE
DR. CLEMENT J. KEVANE
BY Raymond H. Michael
ATTORNEY United States Patent Office 3,166,680

Patented Jan. 19, 1965

3,166,680
TIME DELAY SWITCH

Clement J. Kevane, Tempe, and Raymond J. Schulte, Phoenix, Ariz., assignors to Controls Company of America, Schiller Park, Ill., a corporation of Delaware Filed July 26, 1962, Ser. No. 212,687
9 Claims. (Cl. 307—88.5)

This invention relates to time delay electrical switching devices and, more particularly to a solid state time delay switching device.

It is well known that P-N-P-N diodes, Shockley or switching diodes, possess electrical characteristics suitable for electrical switching in that they have a breakover voltage at which they become electrically conductive and below which they are non-conductive. The advantages stemming from the use of semi-conductors as switching devices are also widely recognized, e.g. unlike commonly used mechanical type switches they are not susceptible to frictional wear and are relatively insensitive to shock and vibrational forces.

The breakover voltage of a P-N-P-N diode varies with the temperature of the diode more particularly breakover voltage decreases as temperature increases and it is an object of this invention to control the temperature of a Shockley diode in such a manner as to provide a time delay switching device.

Another object of this invention is to provide a time delay switching device which has no moving parts and which is substantially insensitive to shock and vibrational forces.

Other objects and advantages will be pointed out in, or be apparent from, the specification and claims as will obvious modifications of the single embodiment shown in the drawings, in which:

Figure 1:
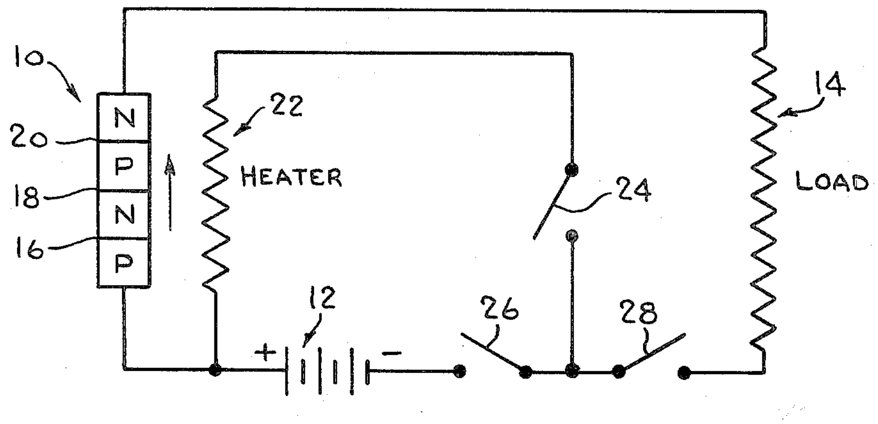
FIG. 1 is a circuit diagram of a preferred embodiment of this invention.

With reference to FIG. 1, P-N-P-N diode 10 is connected in circuit with an electrical source 12 and a load 14. Diode 10 is of the P-N-P-N type described in U.S. Patent No. 2,855,524. For the purposes of this description it is believed sufficient to point out that diode 10 is made up of alternating P and N type layers which form P-N junction 16, N-P junction 18 and P-N junction 20. With current flowing in the direction of the arrow in FIG. 1, junctions 16 and 20 are normally conducting junctions whereas junction 18 is a normally nonconducting junction and clocks the flow of current in the circuit. That is, junction 18 will not conduct substantial current unless the voltage there across is equal to or greater than its breakover voltage $V_0$. Accordingly, diode 10 will be in an "off" state below voltage $V_0$.

Figure 2:
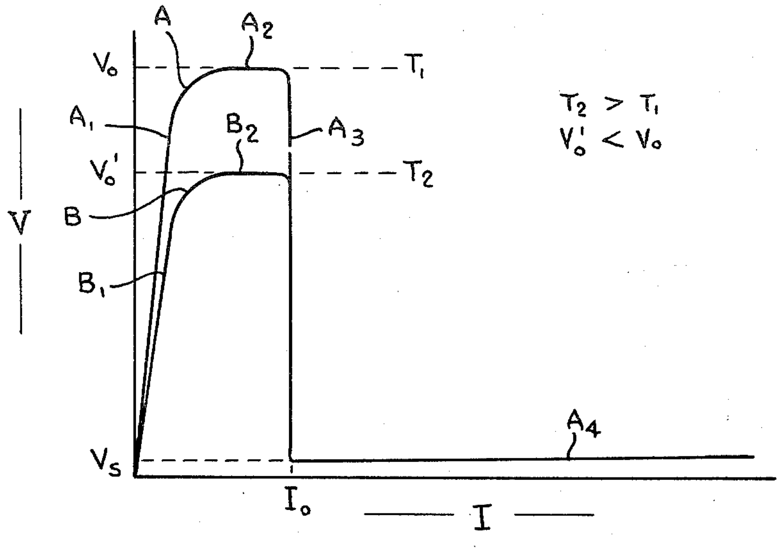
FIG. 2 is a graph plotting voltage against current and illustrating the effect of temperature on the breakover voltage of a P-N-P-N diode.

Curve A of FIG. 2 is a plotting of voltage across junction 18 against the current flow through that junction with diode 10 at a given temperature $T_1$. As illustrated by portion $A_1$ of curve A, at voltages below voltage $V_0$ diode 10 is substantially nonconductive and as the voltage approaches and finally reaches breakover voltage (see portion $A_2$) current flow through the diode gradually increases until it reaches a value $I_0$. Junction 18 is now conductive and the voltage necessary to maintain current flow through the diode falls sharply to a relatively low sustaining voltage $V_s$ (see portion $A_3$). Diode 10 is now in an "on" state and, as illustrated by portion $A_4$, there is a continuous flow of current in the circuit and through load 14.

The characteristics of diode 10 operating at an elevated temperature $T_2$, are shown in curve B in FIG. 2. As is illustrated by portion $B_1$ of curve B, below breakover voltage $V'_0$ the characteristics of diode 10 are substantially identical for both temperatures $T_1$ and $T_2$. However, breakover voltage $V'_0$ is less than breakover voltage $V_0$ and as the voltage across junction 18 approaches and finally reaches voltage $V'_0$ (see portion $B_2$) current flow through the diode gradually increases until it reaches a value $I_0$. Junction 18 is now conductive and the characteristics of diode 10 at temperature $T_2$ are now identical to those at temperature $T_1$, the voltage across junction 18 falling to sustaining voltage $V_s$ and the diode being in an "on" state as illustrated by portion $A_4$.

To control the temperature of diode 10, a heater 22 is positioned adjacent the diode and is connected in parallel with the diode. Switches 24, 26 and 28 are included in the circuit to control operation of the heater and diode and their function will become apparent from the following discussion of the operation of this invention.

Assuming diode 10 to be at a temperature $T_1$, switches 24, 26 and 28 are initially closed and a voltage $V'_0$, which is below the normal breakover voltage for diode 10 at temperature $T_1$, is impressed across the diode and, simultaneously, across heater 22. Diode 10 will initially be substantially nonconductive, voltage $V'_0$ being insufficient to break down junction 18, and there is little current flow through load 14. However, with heater 22 connected in circuit with source 12 there is a flow of current through it to raise the temperature of diode 10. When the diode temperature reaches temperature $T_2$, voltage $V'_0$ is sufficient to break down junction 18 and render the diode conductive thereby switching the diode to an "on" state permitting current to flow to load 14. Therefore, a time delay switching operation is achieved by impressing a voltage on the diode which is below the breakover voltage of the diode at its normal ambient temperature and then heating the diode until it reaches a temperature at which the voltage impressed thereon is sufficient to render the diode conductive. Having been rendered conductive, diode 10 remains conductive without the continued application of heat and switch 24 may be opened to remove the heater from the circuit to allow it to cool. When it is desired to de-energize load 14, either switch 26 or 28 can be opened. It should be noted that it is possible to simultaneously remove both the diode and the heater from the circuit or to remove either the diode or the heater alone. Thus, the length of the time delay can be controlled by opening switch 28 and closing switches 24 and 26 to preheat the diode and reduce the desired time delay. The time delay can also be controlled by controlling the power input to the heater, for example by providing a variable resistance in circuit with heater 22. By closing switches 24 and 26 prior to closing switch 28 it is possible to operate with no time delay. Usually the device would be operated with a time delay by closure of either switch 26 or switch 28 (the other having already been closed) with switch 24 initially closed. Switch 24 permits removal of heater load so as to prepare the diode for re-cycling without a cool-down period.

Accordingly, this invention utilizes the characteristics of reduction in breakover voltage in a Shockley diode at elevated temperatures to achieve a desired time delay. It will be appreciated that the length of the normal time delay, the time necessary to heat the diode to a temperature at which the voltage impressed thereon is sufficient to break down the diodes, is dependent upon the capacity of the heater and/or its proximity to the diode.

Although but one embodiment of the present invention has been illustrated and described, it will be apparent to those skilled in the art that various changes and modifications may be made therein without departing from the spirit of the invention or from the scope of the appended claims.

What we claim is:

1. A time delay switching device comprising, in combination, a P-N-P-N diode, means for impressing a voltage on said diode below its normal breakover voltage, an electrically energized heater adjacent said diode to raise the temperature of said diode to a temperature at which said diode will breakover at said impressed voltage, and switch means for selectively deenergizing said heater and said diode.

2. A time delay switching device comprising, in combination, a P-N-P-N diode, means for impressing a voltage on said diode below its normal breakover voltage, a heater positioned adjacent said diode to heat the diode and reduce its breakover voltage to the impressed voltage, and means for controlling the length of time necessary to render said diode conductive after said predetermined voltage is impressed thereon.

3. A time delay switching device comprising, in combination, a P-N-P-N diode, means for impressing a voltage on said diode below its normal breakover voltage, and an electrically energized heater for raising the temperature of said diode to a temperature at which said diode will breakover at the impressed voltage and become conductive.

4. A time delay switching device comprising, in combination, a P-N-P-N diode, an electrically energized heater in circuit with said diode, means for impressing a voltage on said diode below its normal breakover voltage, and switch means for simultaneously connecting said diode and heater to said voltage impressing means.

5. The combination of claim 4 wherein said switch means includes means for selectively disconnecting said heater from said voltage impressing means.

6. A time delay switching device comprising, in combination, a P-N-P-N diode, an electrically energized heater connected in parallel circuit relationship with said diode, means for impressing a voltage on said diode below its normal breakover voltage, and switch means for controlling the connection of said diode and said heater to said voltage impressing means.

7. The combination of claim 6 wherein said switch means is arranged to simultaneously connect said diode and said heater to said voltage impressing means.

8. The combination of claim 7 wherein said switch means also includes means for selectively disconnecting said heater from said voltage impressing means.

9. The combination of claim 6 wherein said switch means includes a plurality of switches arranged in circuit with said diode and heater so that said diode and said heater can be selectively simultaneously and independently connected to said voltage impressing means.

References Cited in the file of this patent

IBM Technical Disclosure Bulletin, vol. 4, No. 3, page 71, August 1961.

Gutzwiller: "Phase-Controlling Kilowatts With Silicon Semiconductors," reprint from May 1959, issue of Control Engineering (sheets 1 and 2 relied on).

General Electric, Notes on the Application of the Silicon Controlled Rectifier, December 1958 (pages 5, 6, 7 relied on).

UNITED STATES PATENT OFFICE

CERTIFICATE OF CORRECTION

Patent No. 3,166,680 January 19, 1965

Clement J. Kevane et al.

It is hereby certified that error appears in the above numbered patent requiring correction and that the said Letters Patent should read as corrected below.

Column 3, line 20, strike out "and"; line 23, for "conductive." read -- conductive, and means for controlling the length of time necessary to render said diode conductive after said predetermined voltage is impressed thereon. --.

Signed and sealed this 21st day of September 1965.

(SEAL)

Attest:

ERNEST W. SWIDER
Attesting Officer

EDWARD J. BRENNER
Commissioner of Patents